(12) United States Patent
Itou

(10) Patent No.: US 10,951,327 B2
(45) Date of Patent: Mar. 16, 2021

(54) TRANSMISSION APPARATUS AND RECEIVING APPARATUS

(71) Applicant: FUJI ELECTRIC CO., LTD., Kanagawa (JP)

(72) Inventor: Keiichi Itou, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/383,693

(22) Filed: Apr. 15, 2019

(65) Prior Publication Data

US 2019/0372680 A1 Dec. 5, 2019

(30) Foreign Application Priority Data

Jun. 5, 2018 (JP) .............................. JP2018-108003

(51) Int. Cl.
  *H04B 14/02* (2006.01)
  *H04L 7/00* (2006.01)
  *H03K 7/08* (2006.01)
  *G06F 11/20* (2006.01)

(52) U.S. Cl.
  CPC ....... *H04B 14/026* (2013.01); *G06F 11/2076* (2013.01); *H03K 7/08* (2013.01); *H04L 7/0066* (2013.01)

(58) Field of Classification Search
  CPC .. H03K 7/04; H03K 7/08; H03K 9/04; H03K 9/08; H04B 14/02; H04B 14/026; H04L 7/0054; H04L 7/0062; H04L 7/0066; H04L 7/0087; G06F 11/2076

USPC ............... 375/237–239, 364; 370/212, 213; 329/312, 313; 332/109, 112
  See application file for complete search history.

(56) References Cited

U.S. PATENT DOCUMENTS

| | | | |
|---|---|---|---|
| 2011/0176589 A1* | 7/2011 | Kolof | H04L 7/044 375/224 |
| 2012/0195400 A1* | 8/2012 | Tomar | H04L 7/0331 375/354 |
| 2013/0345924 A1* | 12/2013 | Tomar | G01P 15/125 701/30.5 |
| 2015/0066301 A1 | 3/2015 | Kozawa | |
| 2015/0236746 A1* | 8/2015 | Scheinkerman | H04L 67/12 375/219 |
| 2015/0236876 A1* | 8/2015 | Cadugan | H04L 25/03834 375/242 |
| 2018/0172484 A1* | 6/2018 | Hammerschmidt | H04W 4/70 |

FOREIGN PATENT DOCUMENTS

EP     2 040 085 A1 *  3/2009
JP     2015046770 A     3/2015

* cited by examiner

*Primary Examiner* — Young T. Tse

(57) ABSTRACT

To detect an error in pulse width in a communication scheme that identifies a start position of a message or expresses a data value using a pulse width of a pulse included in the message, provided is a receiving apparatus including a receiving section that receives a message including a synchronization pulse having a predetermined pulse width and a first data pulse having a pulse width corresponding to a value of first data; and an error detecting section that detects an error in response to the number of non-synchronization pulses that are consecutive after the synchronization pulse being outside a predetermined number range.

10 Claims, 12 Drawing Sheets

| TICK | 12 | 13 | 14 | 15 | 16 | 17 | 18 | 19 | 20 | 21 | 22 | 23 | 24 | 25 | 26 | 27 |
|------|----|----|----|----|----|----|----|----|----|----|----|----|----|----|----|----|
| DATA | 0 | 1 | 2 | 3 | 4 | 5 | 6 | 7 | 8 | 9 | 0xA | 0xB | 0xC | 0xD | 0xE | 0xF |

FIG. 3

| NIBBLE NUMBER | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| SERIAL DATA BIT 3 | 1 | 0 | 0 | 0 | 0 | 0 | 0 | 0 | 0 | 0 | 0 | 0 | 0 | 0 | 0 | 0 |
| SERIAL DATA BIT 2 | MID | | | | DATA | | | | | | | | | CRC | | |

*FIG. 4*

| NIBBLE NUMBER | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| SERIAL DATA BIT 3 | 1 | 1 | 1 | 1 | 1 | 1 | 0 | 0 | \multicolumn{3}{c\|}{MID} | 0 | \multicolumn{3}{c\|}{MID} | 0 |
| SERIAL DATA BIT 2 | \multicolumn{6}{c\|}{CRC} | \multicolumn{12}{c\|}{DATA} |

FIG. 5

| NIBBLE NUMBER | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| SERIAL DATA BIT 3 | 1 | 1 | 1 | 1 | 1 | 1 | 0 | 1 | | | MID | | | | DATA | | | 0 |
| SERIAL DATA BIT 2 | | | CRC | | | | | | | | | | DATA | | | | | |

*FIG. 6*

| NIBBLE NUMBER | 1 | 2 | 3 | 4 | 5 | | 16 | 17 | 18 |
|---|---|---|---|---|---|---|---|---|---|
| EFFECTIVE FLAG | 1 | 1 | 0 | 1 | 1 | | 1 | 0 | 1 |
| SERIAL DATA BIT 3 | 1 | 1 | – | 1 | 1 | | 1 | – | 0 |
| SERIAL DATA BIT 2 | 1 | 0 | – | 0 | 1 | | 0 | – | 0 |

FIG. 9

TRANSMISSION APPARATUS AND RECEIVING APPARATUS

The contents of the following Japanese patent application are incorporated herein by reference:
2018-108003 filed in JP on Jun. 5, 2018.

BACKGROUND

1. Technical Field

The present invention relates to a transmission apparatus and a receiving apparatus.

2. Related Art

A conventional communication scheme is known that uses the pulse widths of a plurality of pulses included in a message to identify a start position of the message or express a data value. An example of such a communication scheme is SENT (Registered Trademark) communication. In such a communication scheme, a transmission apparatus includes an error detection/correction pulse such as a parity or CRC in the message, to enable detection or correction an error in a data value that is expressed by one or more data pulses, as shown in Patent Document 1.
Patent Document 1: Japanese Patent Application Publication No. 2015-46770

In the above communication scheme, a receiving apparatus determines that a pulse whose pulse width is within a tolerance (e.g. ±20%) of a predetermined pulse width is a synchronization pulse indicating the start position of the message, and receives the data pulses using this synchronization pulse as a reference. Accordingly, in a case where the pulse width of the synchronization pulse is outside the error range, for example, there is a possibility that the receiving apparatus will discard the received pulse and, as a result, not be able to detect the error.

SUMMARY

To solve the above problem, according to a first aspect of the present invention, provided is a receiving apparatus. The receiving apparatus may comprise a receiving section that receives a message including a synchronization pulse having a predetermined pulse width and a first data pulse having a pulse width corresponding to a value of first data. The receiving apparatus may comprise an error detecting section that detects an error in response to the number of non-synchronization pulses that are consecutive after the synchronization pulse being outside a predetermined number range.

The error detecting section may detect the error in response to the number of non-synchronization pulses that are consecutive after the synchronization pulse exceeding a predetermined upper limit number.

The error detecting section may detect the error in response to the number of non-synchronization pulses between synchronization pulses being less than a predetermined lower limit number.

The receiving apparatus may further comprise a synchronization pulse detecting section that detects, as the synchronization pulse, a pulse having a pulse width that is within a predetermined synchronization pulse allowable width range including the predetermined pulse width.

The error detecting section may detect the error in response to the pulse width of the first data pulse being outside a predetermined data pulse allowable width range.

The message may further include a second data pulse having a pulse width corresponding to a value of partial data of second data. The receiving apparatus may further comprise a data acquiring section that acquires the second data that has been encoded after being divided into second data pulses, each of which is the second data pulse, included respectively in a plurality of messages, each of which is the message, of a message group.

The data acquiring section may further acquire error detecting information that has been encoded in a reserved field of the partial data expressed by the second data pulse of each message included in the message group. The error detecting section detects an error of each message in the message group, based on the error detecting information.

The data acquiring section may, in response to an error having been detected in a first message included in a first message group, compensate second data acquired from the first message group with partial data expressed by the second data pulse of a second message, corresponding to the first message, in a second message group.

According to a second aspect of the present invention, provided is a receiving apparatus. The receiving apparatus may comprise a receiving section that receives a message including a synchronization pulse having a predetermined pulse width and a first data pulse having a pulse width corresponding to a value of first data. The receiving apparatus may comprise an error detecting section that detects an error in response to the pulse width of the first data pulse being outside a predetermined data pulse allowable width range.

The receiving apparatus may further comprise a synchronization pulse detecting section that detects, as the synchronization pulse, a pulse having a pulse width that is within a predetermined synchronization pulse allowable width range including the predetermined pulse width. The receiving apparatus may further comprise a data pulse detecting section that detects, as the first data pulse, a pulse at a predetermined pulse position using the synchronization pulse as a reference.

According to a third aspect of the present invention, provided is a receiving method. The receiving method may comprise receiving a message including a synchronization pulse having a predetermined pulse width and a first data pulse having a pulse width corresponding to a value of first data. The receiving method may comprise detecting an error in response to the number of non-synchronization pulses that are consecutive after the synchronization pulse being outside a predetermined number range.

According to a fourth aspect of the present invention, provided is a receiving method. The receiving method may comprise receiving a message including a synchronization pulse having a predetermined pulse width and a first data pulse having a pulse width corresponding to a value of first data. The receiving method may comprise detecting an error in response to the pulse width of the first data pulse being outside a predetermined data pulse allowable width range.

According to a fifth aspect of the present invention, provided is a computer-readable medium storing thereon a receiving program that is executed by a computer. The receiving program may cause the computer to function as a receiving section that receives a message including a synchronization pulse having a predetermined pulse width and a first data pulse having a pulse width corresponding to a value of first data. The receiving program may cause the computer to function as an error detecting section that detects an error in response to the number of non-synchronization pulses that are consecutive after the synchronization pulse being outside a predetermined number range.

According to a sixth aspect of the present invention, provided is a computer-readable medium storing thereon a receiving program that is executed by a computer. The receiving program may cause the computer to function as a receiving section that receives a message including a synchronization pulse having a predetermined pulse width and a first data pulse having a pulse width corresponding to a value of first data. The receiving program may cause the computer to function as an error detecting section that detects an error in response to the pulse width of the first data pulse being outside a predetermined data pulse allowable width range.

According to a seventh aspect of the present invention, provided is a transmission apparatus. The transmission apparatus may comprise a transmission data acquiring section that acquires a plurality of sets of first data and second data to be transmitted. The transmission apparatus may comprise a message generating section that generates, as each of a plurality of messages in a message group, a message including a synchronization pulse having a predetermined pulse width, a first data pulse having a pulse width corresponding to first data that corresponds to the message, among the plurality of sets of first data, and a second data pulse having a pulse width corresponding to partial data that is of the second data and to be encoded in the message. The transmission apparatus may comprise a transmitting section that transmits each message of the message group. The message generating section may encode additional information in a reserved field of the partial data expressed by the second data pulse.

According to an eighth aspect of the present invention, provided is a transmitting method. In the transmitting method, a transmission apparatus may acquire a plurality of sets of first data and second data to be transmitted. In the transmitting method, the transmission apparatus may generate, as each of a plurality of messages in a message group, a message including a synchronization pulse having a predetermined pulse width, a first data pulse having a pulse width corresponding to first data that corresponds to the message, among the plurality of sets of first data, and a second data pulse having a pulse width corresponding to partial data that is of the second data and to be encoded in the message. In the transmitting method, the transmission apparatus may transmit each message of the message group. The message generation may include encoding additional information in a reserved field of the partial data expressed by the second data pulse.

According to a ninth aspect of the present invention, provided is a computer-readable medium storing thereon a transmitting program that is to be executed by a computer. The transmitting program may cause the computer to function as a transmission data acquiring section that acquires a plurality of sets of first data and second data to be transmitted. The transmitting program may cause the computer to function as a message generating section that generates, as each of a plurality of messages in a message group, a message including a synchronization pulse having a predetermined pulse width, a first data pulse having a pulse width corresponding to first data that corresponds to the message, among the plurality of sets of first data, and a second data pulse having a pulse width corresponding to partial data that is of the second data and to be encoded in the message. The transmitting program may cause the computer to function as a transmitting section that transmits each message of the message group. The message generating section may encode additional information in a reserved field of the partial data expressed by the second data pulse.

The summary clause does not necessarily describe all necessary features of the embodiments of the present invention. The present invention may also be a sub-combination of the features described above.

BRIEF DESCRIPTION OF THE DRAWINGS

FIG. 3 shows a correspondence between the data values and the pulse widths of data pulses in a message according to the present embodiment.

FIG. 4 shows a first example of data transmitted by the status pulse of the message according to the present embodiment.

FIG. 5 shows a second example of data transmitted by the status pulse of the message according to the present embodiment.

FIG. 6 shows a third example of data transmitted by the status pulse of the message according to the present embodiment.

FIG. 9 shows a storage state of the received data in the receiving apparatus 30 according to the present embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
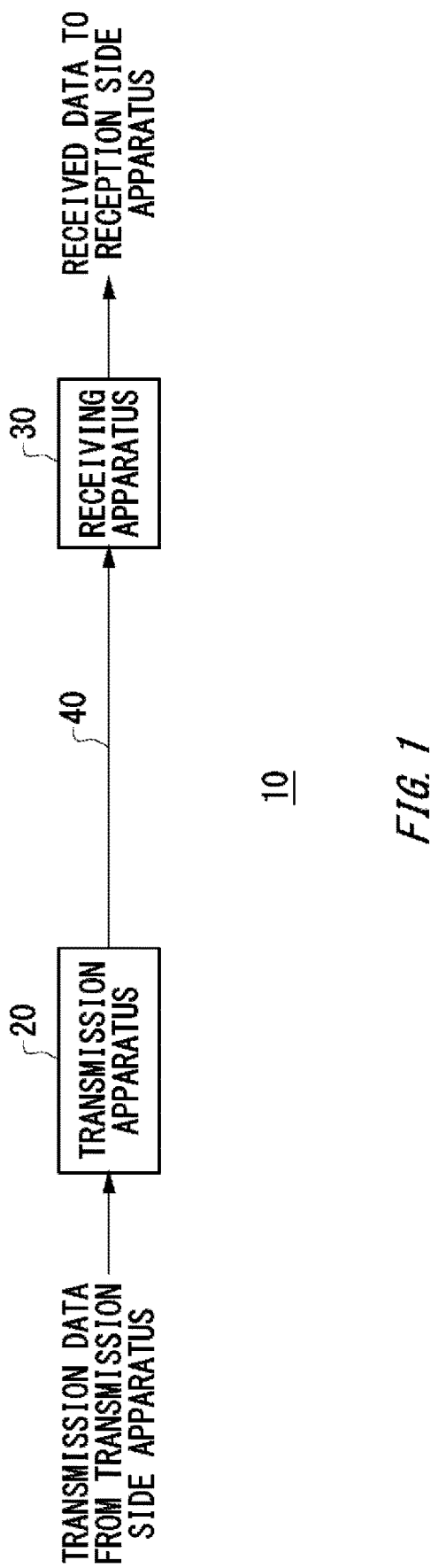
FIG. 1 shows a configuration of a communication scheme 10 according to the present embodiment.

FIG. 1 shows a configuration of a communication scheme 10 according to the present embodiment. The communication scheme 10 includes a transmission apparatus 20, a receiving apparatus 30, and a communication path 40.

The transmission apparatus 20 is connected to the receiving apparatus 30 via the communication path 40, and transmits to the receiving apparatus 30 a message including transmission data received from a transmission side apparatus. The transmission apparatus 20 according to the present embodiment is connected to an apparatus including a sensor such as a pressure sensor, for example, and transmits to the receiving apparatus 30 a message including sensor data acquired from the sensor.

The receiving apparatus 30 is connected to the transmission apparatus 20 via the communication path 40, receives the message from the transmission apparatus 20, and supplies a reception side apparatus with the received data. The receiving apparatus 30 according to the present embodiment supplies the reception side apparatus with sensor data included in the message received from the transmission apparatus 20, for example. The reception side apparatus receives this sensor data, and controls an apparatus such as a vehicle or an engine provided with the communication scheme 10 according to the sensor data.

The communication path 40 provides a connection between the transmission apparatus 20 and the receiving apparatus 30. The communication path 40 is a communication path for an in-vehicle network, for example, and may be a connection using a serial signal line.

The communication scheme 10 may be used as various types of communication interfaces for intended uses other than the use described above. Furthermore, the receiving apparatus 30 may, instead of being a receiving apparatus used in an actual application of the communication scheme 10, be a receiving apparatus included in a test apparatus, diagnostic apparatus, or the like used for testing, diagnosis, or the like of the transmission apparatus 20 or the communication path 40, for example.

Figure 2:
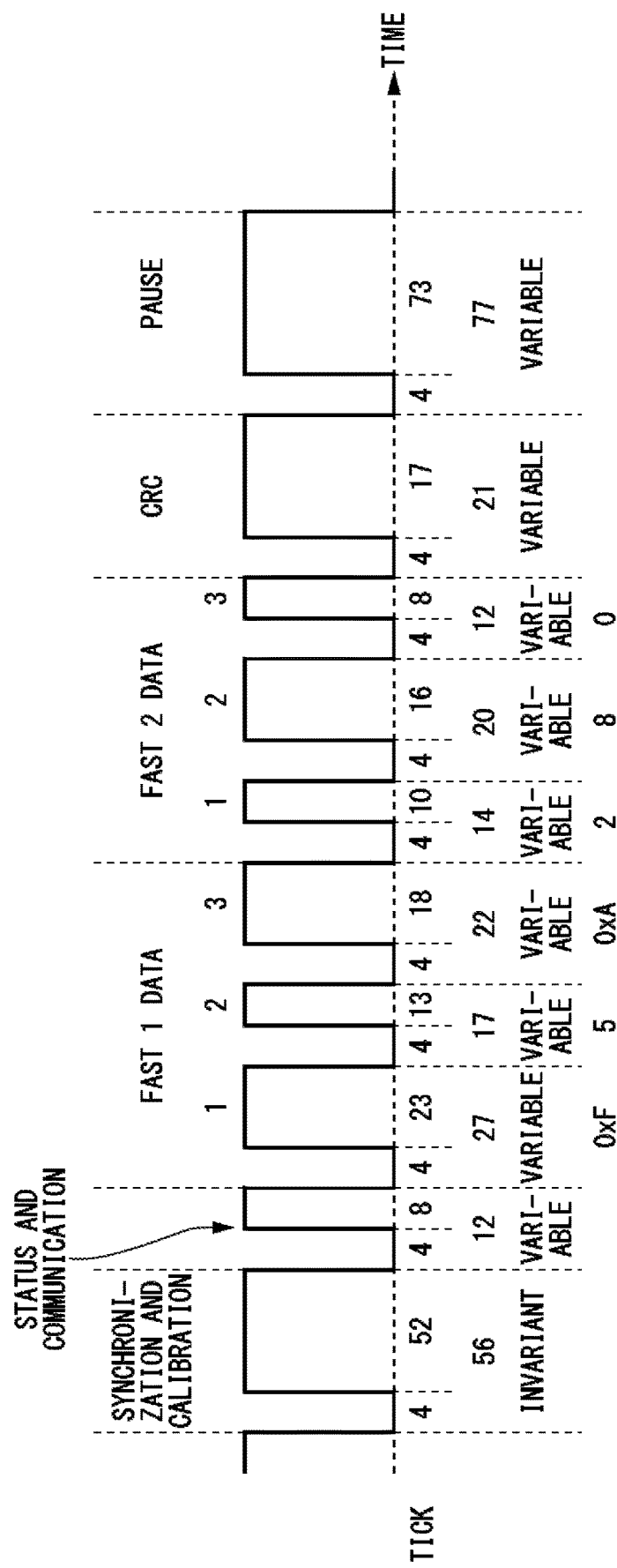
FIG. 2 shows an example of a message according to the present embodiment.

FIG. 2 shows an example of a message according to the present embodiment. In the present example, the message is transmitted by a serial signal that assumes the binary values of logical high (logical H) and logical low (logical L). Logical H may assume a voltage value that is greater than or equal to a predetermined threshold voltage, and logical L may assume a voltage value that is less than the threshold voltage. The message includes a plurality of pulses. Each pulse rises from logical L to logical H and then falls to logical L after a predetermined time according to the pulse has passed. The time duration of the interval during which the pulse is logical H is referred to as the pulse width.

In the present embodiment, an example is described of a case where the SENT (Single-Edge Nibble Transmission) protocol is used as the communication scheme. With the SENT protocol, the message includes a synchronization/calibration pulse, a status and communication pulse, a plurality (three) of fast 1 data pulses, a plurality (three) of fast 2 data pulses, a CRC pulse, and a pause pulse.

The synchronization/calibration pulse has a predetermined pulse width. With the SENT protocol, the synchronization/calibration pulse is a pulse with an invariant pulse width that assumes logical H during a pulse width of 52 unit intervals (also referred to as a "tick"). Here, with the SENT protocol, the pulse width is defined in units of a tick (e.g. 3 μs) that is a length of time predetermined between the transmission apparatus 20 and the receiving apparatus 30. The synchronization/calibration pulse is an example of a synchronization pulse, and indicates the start position of the message.

The status and communication pulse (also referred to as a "status pulse") is the pulse following the synchronization/calibration pulse, and is a pulse with a variable pulse width that assumes logical H during a pulse width corresponding to a data value of the status or the like. The status pulse transmits data of the status or the like, and is also referred to as a "second data pulse". The status pulse transmits 4-bit (1-nibble) data indicating the status or the like.

The fast 1 data pulses are the three pulses following the status pulse, and are pulses with variable pulse widths that correspond to a value of the fast 1 data. The fast 2 data pulses are the three pulses following the fast 1 data pulses, and are pulses with variable pulse widths that correspond to a value of the fast 2 data. These data pulses are an example of "first data pulses". These data pulses each transmit 4-bit data (data that is an example of "first data").

The CRC pulse is the pulse following the fast 2 data pulses, and is a pulse with a variable pulse width corresponding to the value of an error detection/calibration code. The CRC pulse transmits a 4-bit error detection/calibration code.

The pause pulse is a pulse arranged between consecutive messages, and has a pulse width that fills the space from the end of the CRC pulse of the previous message to before the synchronization/calibration pulse of the next message. The pulse width of the pause pulse is set to be at least greater than the pulse width of the synchronization/calibration pulse. With the SENT protocol, the pause pulse is optional, and if the pause pulse is not used, the signal is set to logical L between the CRC pulse and the synchronization/calibration pulse.

With the SENT protocol, a 4-tick interval of logical L is provided between each of the pulses described above.

FIG. 3 shows a correspondence between the data values and the pulse widths of data pulses in a message according to the present embodiment. The present drawing can also be applied to the status pulse and CRC pulse that transmit data as status data and synchronization/calibration code.

With the SENT protocol, a pulse exhibiting a data value 0 as shown in this drawing has a 12-tick pulse width, a pulse exhibiting a data value of 1 has a 13-tick pulse width, and a pulse exhibiting a data value of 15 (0xF) has a 27-tick pulse width, and this is true for the following as well.

FIG. 4 shows a first example of data transmitted by the status pulse of the message according to the present embodiment. The SENT protocol specifies data transmission (data transmission by Slow channel) that encodes data after dividing the data into status pulses of a plurality of messages, in addition to the data transmission by the fast 1 data and the fast 2 data. Two types of formats, which are a Short format and an Enhanced format, are specified for the data transmission by the Slow channel. The present drawing shows the Short format, among these two types.

In the Short format, the transmission apparatus 20 divides this data into status pulses included respectively in messages of a message group that includes 16 consecutive messages, and encodes the data. In the present drawing, the nibble number indicates the number of the status pulse in the Short format, and is the same as the number of the message in the message group. Each status pulse includes 4-bit (1-nibble) data, but only two of these bits (serial data bits 3 and 2) are used in the Short format.

In the Short format, serial data bit 3 includes a bit sequence of "1000000000000000" in nibbles 1 to 16. Serial data bit 2 includes a message ID ("MID" in the present drawing) in nibbles 1 to 4, data in nibbles 5 to 12, and the CRC in nibbles 13 to 16. The data encoded in serial data bits 2 and 3 in the Short format is an example of "second data".

The message ID is a 4-bit message identification number relating to the data transmitted by the Slow channel. The data is 8-bit data transmitted by the Slow channel. The CRC is a CRC relating to the data transmitted by the Slow channel, and may be the CRC of the message ID and the data portion.

FIG. 5 shows a second example of data transmitted by the status pulse of the message according to the present embodiment. The present drawing shows a case where a configuration bit is 0 in the Enhanced format.

In the Enhanced format, the transmission apparatus 20 encodes the data after dividing the data into status pulses included respectively in messages of a message group that includes 18 consecutive messages. In the present drawing, the nibble number indicates the number of the status pulse in the Enhanced format, and is the same as the number of the message in the message group. In the Enhanced format as well, two bits (serial data bits 3 and 2) in each status pulse (1 nibble) are used.

In the Enhanced format, when the configuration bit is set to 0, serial data bit 3 includes "111111" in nibbles 1 to 6, "0" in nibble 7, the configuration bit "0" in nibble 8, (part of) the message ID in nibbles 9 to 12, "0" in nibble 13, (part of) the message ID in nibbles 14 to 17, and "0" in nibble 18. Serial data bit 2 includes the CRC in nibbles 1 to 6 and the data in nibbles 7 to 18. The data encoded in serial data bits 3 and 2 in the Enhanced format is an example of "second data".

The message ID is an 8-bit message identification number relating to data transmitted by the Slow channel. The data is 12-bit data transmitted by the Slow channel. The CRC is a CRC relating to the data transmitted by the Slow channel, and may be the CRC of the message ID and the data portion.

FIG. 6 shows a third example of data transmitted by the status pulse of the message according to the present embodiment. The present drawing shows a case where the configuration bit is 1 in the Enhanced format.

In the Enhanced format, when the configuration bit is set to 1, serial data bit 3 includes "111111" in nibbles 1 to 6, "0" in nibble 7, the configuration bit "1" in nibble 8, the message ID in nibbles 9 to 12, "0" in nibble 13, (part of) the data in nibbles 14 to 17, and "0" in nibble 18. Serial data bit 2 includes the CRC in nibbles 1 to 6 and (part of) the data in nibbles 7 to 18.

The message ID is a 4-bit message identification number relating to data transmitted by the Slow channel. The data is 16-bit data transmitted by the Slow channel. The CRC is a CRC relating to the data transmitted by the Slow channel, and may be the CRC of the message ID and the data portion.

The receiving apparatus 30 can distinguish between the Short format and the Enhanced format according to whether there are six consecutive messages in which the serial data bit 3 is "1". In the case of the Short format, the receiving apparatus 30 can determine that the message in which serial data bit 3 is "1" is the start of the message group. In the case of the Enhanced format, the receiving apparatus 30 can determine that the message including the starting "1" among the six consecutive "1"s in serial data bit 3 is the start of the message group.

Figure 7:
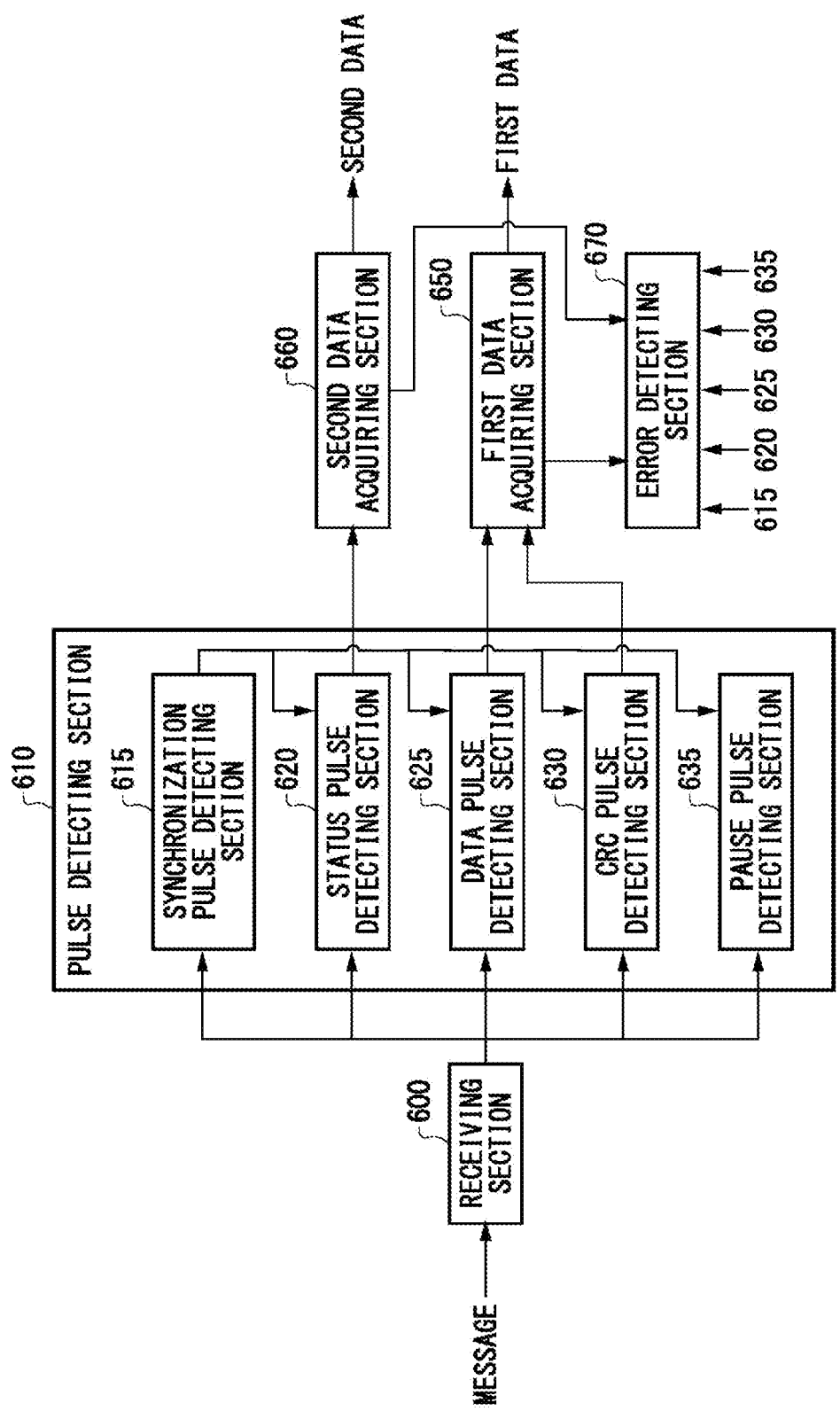
FIG. 7 shows a configuration of the receiving apparatus 30 according to the present embodiment.

FIG. 7 shows a configuration of the receiving apparatus 30 according to the present embodiment. The receiving apparatus 30 includes a receiving section 600, a pulse detecting section 610, a first data acquiring section 650, a second data acquiring section 660, and an error detecting section 670.

The receiving section 600 receives the message transmitted by the transmission apparatus 20 via the communication path 40. The receiving section 600 determines the logical value (logical H or logical L) of the signal by comparing the signal received from the communication path 40 to a threshold voltage, for example.

The pulse detecting section 610 identifies a pulse from the signal sequence of the received message and calculates the pulse width. In the present embodiment, the pulse detecting section 610 observes the logical value of the signal determined by the receiving section 600 to detect the pulse width of each pulse. The pulse detecting section 610 may be realized by a specialized circuit, or may instead be realized by the execution of a program by a microcontroller or the like. If realized by the execution of a program by a microcontroller or the like, the pulse detecting section 610 may generate an interrupt triggered by at least one of a change from logical L to logical H and a change from logical H to logical L in the signal determined by the receiving section 600, and measure the interval from this trigger until the next trigger that is received using a timer or the like. Here, if a predetermined interval (e.g. 4 ticks) is provided between the pulses, such as shown in FIG. 2, the pulse detecting section 610 can, by measuring the time interval between two timings at which the signal changes from logical L to logical H, measure the pulse interval (a time duration obtained by adding this predetermined interval to the pulse width of the pulse positioned between these two timings).

The pulse detecting section 610 determines which type of pulse among the types shown in FIG. 2, for example, each pulse is, using the pulse width (or pulse interval) of this pulse. The pulse detecting section 610 includes a synchronization pulse detecting section 615, a status pulse detecting section 620, a data pulse detecting section 625, a CRC pulse detecting section 630, and a pause pulse detecting section 635.

The synchronization pulse detecting section 615 detects, as the synchronization pulse, a pulse having a pulse width (52 ticks in FIG. 2) of a predetermined synchronization pulse. Here, the synchronization pulse detecting section 615 detects, as the synchronization pulse, a pulse having a pulse width within a predetermined synchronization pulse allowable width range that includes the specified pulse width of the synchronization pulse. For example, if the allowable width that is allowed for the synchronization pulse is ±20%, the synchronization pulse detecting section 615 sets a range of 52 ticks±20% as the synchronization pulse allowable width range and identifies, as the synchronization pulse, a pulse having a pulse width within this range.

The status pulse detecting section 620 detects, as the status pulse, a pulse (the pulse following the synchronization pulse in FIG. 2) at a predetermined pulse position using the synchronization pulse as a reference. Here, the status pulse detecting section 620 may be designed to, if the pulse following the synchronization pulse has the pulse width of the synchronization pulse (a pulse width allowable for the synchronization pulse) or a greater pulse width than this, not detect this pulse as the status pulse.

The data pulse detecting section 625 detects, as the data pulses, pulses at predetermined pulse positions using the synchronization pulse as a reference. In the communication protocol of FIG. 2, the data pulse detecting section 625 detects the three pulses that are the second to fourth pulses, counting from after the synchronization pulse, as the fast 1 data pulses, and detects the three pulses that are the fifth to seventh pulses, counting from after the synchronization pulse, as the fast 2 data pulses. Here, the data pulse detecting section 625 may be designed to, if these pulses have the pulse width of the synchronization pulse (a pulse width allowable for the synchronization pulse) or a greater pulse width than this, not detect these pulses as the data pulses.

The CRC pulse detecting section 630 detects, as the CRC pulse, a pulse (the eighth pulse counting from after the synchronization pulse in FIG. 2) at a predetermined pulse position using the synchronization pulse as a reference. Here, the CRC pulse detecting section 630 may be designed to, if the pulse at this position has the pulse width of the synchronization pulse (a pulse width allowable for the synchronization pulse) or a greater pulse width than this, not detect this pulse as the CRC pulse.

The pause pulse detecting section 635 detects, as the pause pulse, a pulse (the ninth pulse counting from after the synchronization pulse in FIG. 2) at a predetermined pulse position using the synchronization pulse as a reference. Here, the pause pulse detecting section 635 may be designed to, if the pulse at this position has the pulse width of the synchronization pulse (a pulse width allowable for the synchronization pulse), not detect this pulse as the pause pulse. It should be noted that the pause pulse detecting section 635 may detect, as the pause pulse, a pulse having a pulse width that exceeds the pulse width of the synchronization pulse.

The first data acquiring section 650 determines a first data value corresponding to the pulse width of each first data pulse detected by the data pulse detecting section 625, using the correspondence relationship shown in FIG. 3, and acquires the data value of the fast 1 data and the data value of the fast 2 data. Furthermore, the first data acquiring section 650 determines a CRC value corresponding to the pulse width of the CRC pulse detected by the CRC pulse detecting section 630, using the correspondence relationship shown in FIG. 3. The first data acquiring section 650 then performs error detection and calibration of the fast 1 data and the fast 2 data using the CRC value.

The second data acquiring section 660 determines a second data value corresponding to the pulse width of the status pulse (second data pulse) detected by the status pulse detecting section 620, using the correspondence relationship shown in FIG. 3. The second data acquiring section 660 then acquires the second data, which has been encoded after being divided into each status pulse of the message group including a plurality of consecutive messages. Furthermore, the second data acquiring section 660 performs error detection and calibration of the second data, using the CRC value included in the Slow channel shown in FIGS. 3 to 5.

The error detecting section 670 detects the error according to the results of the pulse detection by the pulse detecting section 610, the results of the error detection and calibration by the first data acquiring section 650, the results of the error detection and calibration by the second data acquiring section 660, and the like.

Figure 8:
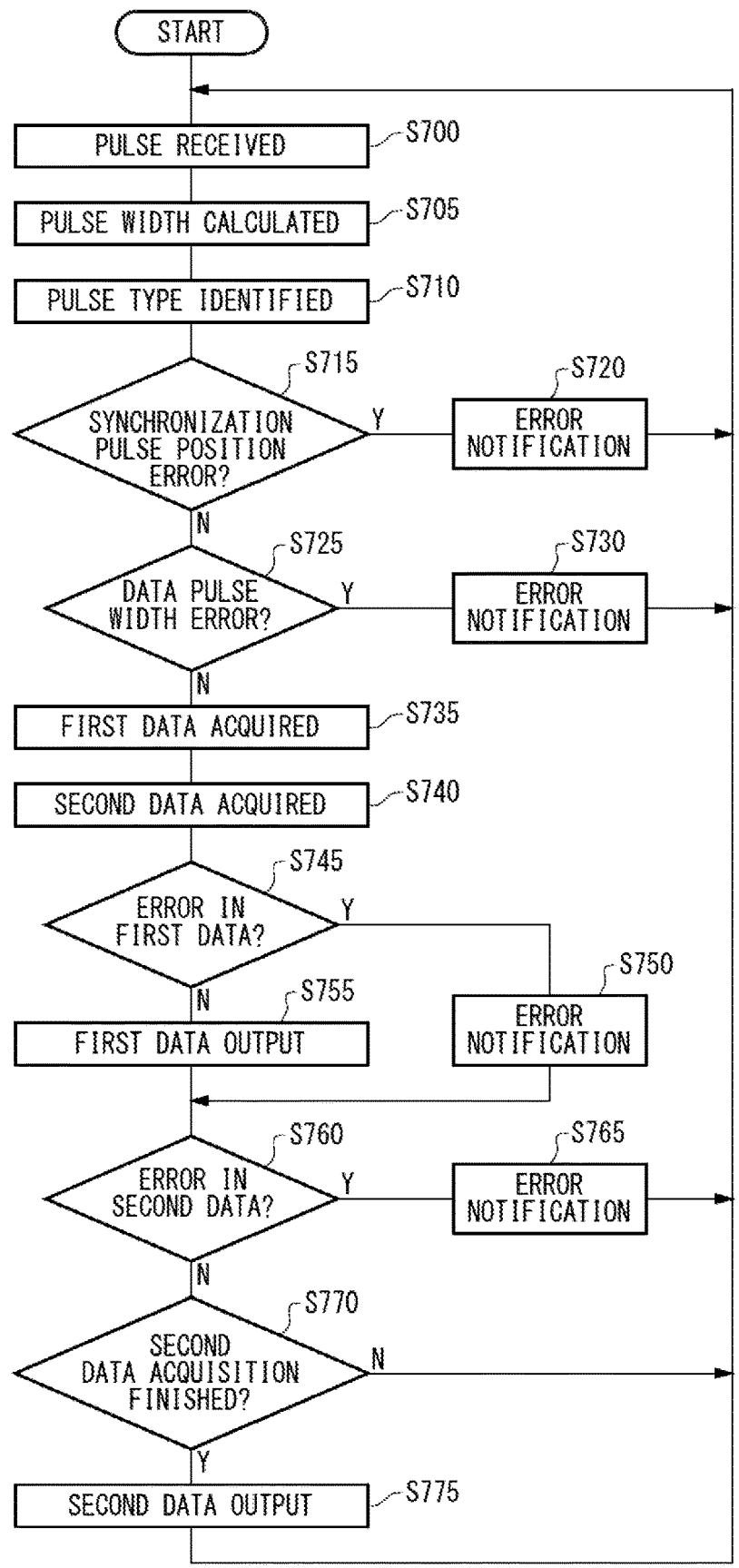
FIG. 8 shows an operational flow of the receiving apparatus 30 according to the present embodiment.

FIG. 8 shows an operational flow of the communication scheme 10 according to the present embodiment. At step S700, the receiving section 600 receives the signal sequence of a message. At S705, the pulse detecting section 610 specifies pulses from the received signal sequence of the message and calculates the pulse width of each pulse.

At S710, the synchronization pulse detecting section 615, the status pulse detecting section 620, the data pulse detecting section 625, the CRC pulse detecting section 630, and the pause pulse detecting section 635 in the pulse detecting section 610 identify the type (synchronization pulse, status pulse, data pulse, CRC pulse, or pause pulse in the communication protocol of FIG. 2) of each pulse.

Here, at least one of the status pulse detecting section 620, the data pulse detecting section 625, the CRC pulse detecting section 630, and the pause pulse detecting section 635 in the pulse detecting section 610 adjusts the time length of 1 tick used as a unit for the pulse width of at least one of the status pulse, data pulses, CRC pulse, and pause pulse, according to the error in the pulse width of a pulse detected as the synchronization pulse immediately prior. For example, these pulse detecting sections may obtain the number of ticks of a target pulse, using, as the time length of 1 tick, a value obtained by dividing the pulse width (time length) of the pulse detected as the synchronization pulse immediately prior by the number of ticks (e.g. 52) of the synchronization pulse.

As an example, if the synchronization pulse with a pulse width of 182 µs has been detected, despite the time length of 1 tick between the transmission apparatus 20 and the receiving apparatus 30 having been determined to be 3 µs, the synchronization pulse detecting section 615 notifies the other pulse detecting sections that the time length of 1 tick is set to 3.5 µs (=182/52). Each pulse detecting section may receive this notification and calculate the number of ticks of each pulse using a time length of 3.5 µs as the standard for one tick. In this way, even in a case where an error has occurred in the time length of 1 tick in a pulse transmitted by the transmission apparatus 20, the receiving apparatus 30 can adjust the time length of 1 tick based on the pulse width of the synchronization pulse and accurately determine the number of ticks of each pulse.

Instead of this, each pulse detecting section in the pulse detecting section 610 may obtain the number of ticks of each pulse using a predetermined time length of 1 tick between the transmission apparatus 20 and the receiving apparatus 30 that does not depend on the pulse width of the synchronization pulse. In this way, even in a case where a change in only the pulse width of the synchronization pulse, due to temporary noise, has been observed in the communication scheme 10 in which the transmission apparatus 20 and the receiving apparatus 30 operate using the same clock as a reference, for example, the receiving apparatus 30 can correctly determine the number of ticks of each other pulse.

At S715, the error detecting section 670 determines whether there is an error at the position of the pulse identified as the synchronization pulse. Here, the error detecting section 670 detects the error in response to the number of non-synchronization pulses that are consecutive after the synchronization pulse being outside a predetermined number range. For example, the error detecting section 670 may detect an error in response to the number of non-synchronization pulses that are consecutive after the synchronization pulse exceeding a predetermined upper limit number (9 in the example of FIG. 2). In this way, even in a case where the pulse width of a pulse to be detected as the synchronization pulse was not detected as the synchronization pulse due to noise or the like causing the pulse width thereof to be outside the synchronization pulse allowable width range, the error detecting section 670 can detect this as an error without simply discarding the message that starts from this synchronization pulse.

As a further example, the error detecting section 670 may detect an error in response to the number of non-synchronization pulses, between synchronization pulses, being less than a predetermined lower limit number (9 in the example of FIG. 2). In this way, even in a case where the pulse width of a pulse that is not supposed to be detected as the synchronization pulse has been detected as the synchronization pulse due to noise or the like causing this pulse width to be within the synchronization pulse allowable width range, the error detecting section 670 can detect this as an error without receiving the message starting from the erroneous synchronization pulse and simply outputting this message as erroneous data.

In the communication protocol shown in FIG. 2, it is optional whether or not the pause pulse is provided. Therefore, the error detecting section 670 may be configured to detect an error in response to the number of non-synchronization pulses that are consecutive after the synchronization pulse not being 8 or 9, and to not erroneously detect an error regardless of whether or not the pause pulse is present.

When an error is detected in S715, the error detecting section 670, at S720, provides notification of the error to an apparatus or the like that receives the reception data from the receiving apparatus 30.

At S725, the error detecting section 670 determines whether the width of a pulse identified as a data pulse is suitable. As an example, the error detecting section 670 may provide notification of an error in response to the pulse width of any data pulse being outside of a predetermined data pulse allowable width range. Here, the error detecting section 670 may broadly treat any combination of the status pulse, a fast 1 data pulse, a fast 2 data pulse, and the CRC pulse whose pulse width corresponds to the data as a data pulse to be a target of this error detection. The error detecting section 670 may use, as the data pulse allowable width range, any pulse width greater than or equal to a pulse width obtained by subtracting an allowable error from a minimum pulse width (12 ticks in FIG. 3) corresponding to the data value, any pulse width less than or equal to a pulse width obtained by adding an allowable error to a maximum pulse width (27 ticks in FIG. 3) corresponding to the data value, or a range that satisfies both of these conditions. In this way, even when a multi-bit error, such as an error that cannot be detected or calibrated by the CRC, has occurred due to noise or the like causing the pulse width of a data pulse to be outside of the data pulse allowable width range, the error detecting section 670 can detect this as an error.

When an error is detected at S725, the error detecting section 670 notifies the reception side apparatus or the like connected to the receiving apparatus 30 about the error.

At S735, the first data acquiring section 650 acquires the first data corresponding to the pulse width of each first data pulse (each of the three fast 1 data pulses and the three fast 2 data pulses) detected by the data pulse detecting section 625. Here, the first data acquiring section 650 performs error detection and calibration of the first data using the value of the CRC data corresponding to the pulse width of the CRC pulse detected by the CRC pulse detecting section 630.

At S740, the second data acquiring section 660 acquires the second data encoded after this data is divided into the second data pulse (status pulse in FIG. 2) included in each message of the message group including the number of messages such as shown in FIGS. 4 to 6. Here, the second data is data of the message ID, data, CRC, and the like in FIGS. 4 to 6, which is encoded after being divided such that part of the data is in each second data pulse included in the plurality of messages. The second data acquiring section 660 performs error detection and calibration of the message ID and the data using the CRC data acquired from the second data pulse of the message group.

At S745, the error detecting section 670 determines whether there is an error in the first data acquired by the first data acquiring section 650. The error detecting section 670, in response to having determined that there is an error for which error calibration cannot be performed in the first data, notifies the reception side apparatus or the like about this error (S750).

At S755, the first data acquiring section 650 outputs each acquired piece of the first data to the reception side apparatus. Here, if the first data acquiring section 650 has detected an error in the first data and performed calibration, the error detecting section 670 may notify the reception side apparatus that the error has been detected and calibrated, if the error is minor, for example.

At S760, the error detecting section 670 determines whether there is an error in the second data acquired by the second data acquiring section 660. The error detecting section 670, in response to having determined that there is an error for which the calibration cannot be performed in the second data, notifies the reception side apparatus or the like about this error (S765).

At S770, the receiving apparatus 30 determines whether all of the messages of the message group have been received and the acquisition of the second data has finished. If the acquisition of the second data is not finished, the receiving apparatus 30 moves the process to S700 and receives the next message. If the acquisition of the second data has finished, the receiving apparatus 30 moves the process to S775.

At S775, the second data acquiring section 660 outputs the acquired second data to the reception side apparatus. Here, if the second data acquiring section 660 has detected an error in the second data and performed calibration, the error detecting section 670 may notify the reception side apparatus that the error has been detected and calibrated, if the error is minor, for example.

The receiving apparatus 30 repeats the processes shown above every time a signal sequence from a synchronization pulse to a following synchronization pulse is received.

FIG. 9 shows a storage state of the received data (second data) in the receiving apparatus 30 according to the present embodiment. In the Short format and Enhanced format shown in FIGS. 4 to 6, the receiving apparatus 30 acquires the second data (message ID, data, CRC, and the like in FIGS. 4 to 6) transmitted by the Slow channel from the second data pulse (status pulse) of each message included in the message group having a plurality of messages (16 or 18 messages). Here, if any message among the plurality of messages included in the message group is dropped due to an error or the like, the receiving apparatus 30 becomes unable to acquire the second data from this message group. Therefore, the second data acquiring section 660 in the receiving apparatus 30 may have a function to, in response to an error having been detected in a first message included in a first message group, compensate the second data acquired from the first message group with partial data indicated by a second data pulse of a second message corresponding to the first message in a second message group.

The example in the present drawing shows a storage state of the received data in a case where the receiving apparatus received the first message group having the Enhanced format but was unable to receive the second data pulse due to the $3^{rd}$ and $17^{th}$ messages being dropped because of an error. If the partial data (nibble) corresponding to the status pulse of each message in the first message group was able to be correctly received, the second data acquiring section 660 in the receiving apparatus 30 stores information ("effective flag=1" in the present drawing) indicating that this partial data is effective, and if this partial data was unable to be correctly received, the second data acquiring section 660 stores information ("effective flag=0" in the present drawing) indicating that this partial data is ineffective.

In the configuration having this function, the transmission apparatus 20 transmits message groups in which the second data transmitted by the Slow channel is the same a plurality of times, such that the second data can be correctly transmitted even when a message in the message group is dropped.

The second data acquiring section 660 within the receiving apparatus 30, in response to the second message group having been received in a state where at least one message included in the first message group has been dropped, compensates the partial data corresponding to the status pulse of the message dropped in the first message group using the partial data corresponding to the status pulse of the corresponding message in the second message group. In the example of the present drawing, the second data acquiring section 660 outputs, as the second data of the first message group that has been transmitted by the Slow channel, the second data in which the partial data of the $3^{rd}$ and $17^{th}$ messages, for which the effective flag is 0, is partial data corresponding to the status pulses of the $3^{rd}$ and $17^{th}$ messages in the second message group. Here, if there is partial data dropped despite using a message in the second group as well, the second data acquiring section 660 may compensate the dropped partial data using a message in the third message group.

In the example described above, the second data acquiring section 660 compensates for the dropping of a message included in the first message group using a corresponding message in the second message group coming after the first message group. Instead of or in addition to this, the second data acquiring section 660 may compensate for the dropping of a message included in the first message group using a corresponding message in a second message group that comes before the first message group. For example, if the first message group in which the $4^{th}$ message has been dropped has been received in a state where the second message group in the Enhanced format has been received and the received data is stored as shown in the present drawing, the second data acquiring section 660 may output the second data in which the partial data of the $4^{th}$ message in the first message group is the partial data of the $4^{th}$ message in the second message group received earlier, as the second data of the first message group transmitted by the Slow channel.

The second data acquiring section 660 may perform the process described above independently for every message ID in each of the Short format and the Enhanced format, the Short format, the Enhanced format in which the configuration bit is 0, and the Enhanced format in which the configuration bit is 1, or for every combination thereof. In this way, if the Slow channels of the first message group and the second message group show data for the same message ID, for example, the second data acquiring section 660 compensates the partial data between these, and if these message groups show data for different message IDs, the second data acquiring section 660 can compensate for the dropping of a message while performing the Slow channel transmission in parallel for every message ID, without compensating the partial data between the first message group and the second message group in which completely different second data is transmitted.

Figure 10:
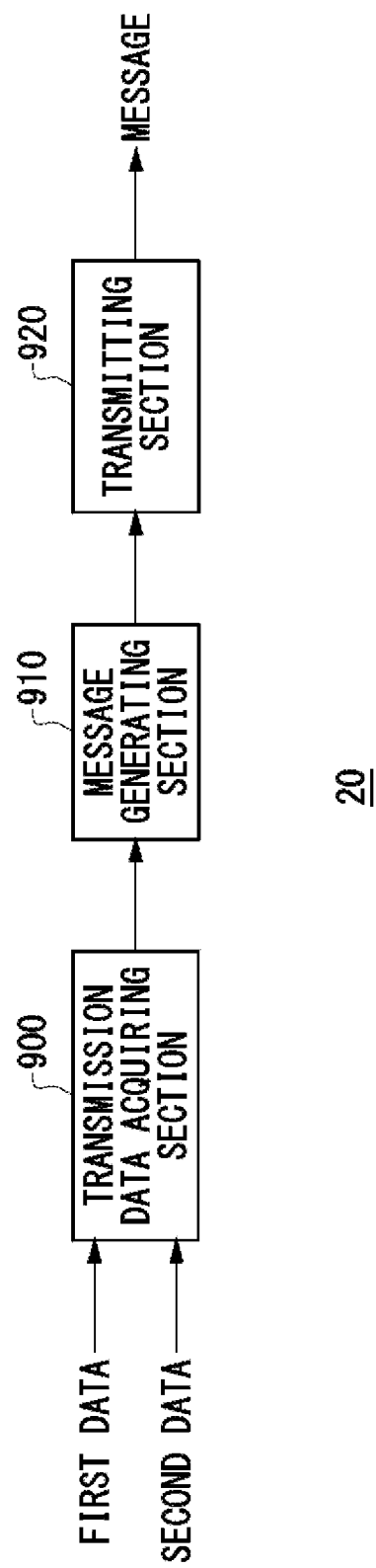
FIG. 10 shows a configuration of the transmission apparatus 20 according to the present embodiment.

FIG. 10 shows the configuration of the transmission apparatus 20 according to the present embodiment. The transmission apparatus 20 includes a transmission data acquiring section 900, a message generating section 910, and a transmitting section 920.

The transmission data acquiring section 900 acquires a plurality of sets of first data and the second data to be transmitted. Here, the second data is data that is encoded by being distributed into the second data pulse (status pulse in FIG. 2) of each message in a message group configured in the Short format or the Enhanced format, and may include the message ID, the main body of the data, and the like. Each of the plurality of sets of first data is data encoded in the first data pulses (fast 1 data pulses and fast 2 data pulses in FIG. 2) of each message in the message group.

The message generating section 910 generates each message in the message group used to transmit the plurality of sets of first data and the second data. The message generating section 910 includes, in each message, the synchronization pulse having a predetermined pulse width, the first data pulse having a pulse width corresponding to this message among the plurality of sets of first data, and the second data pulse having a pulse width corresponding to the partial data to be encoded in this message in the second data. The message generating section 910, for each message, calculates the CRC value for the first data and the CRC value for the partial data of the second data, and includes these CRC values in the message. The transmitting section 920 transmits to the receiving apparatus 30 each message in the message group generated by the message generating section 910.

Figure 11:
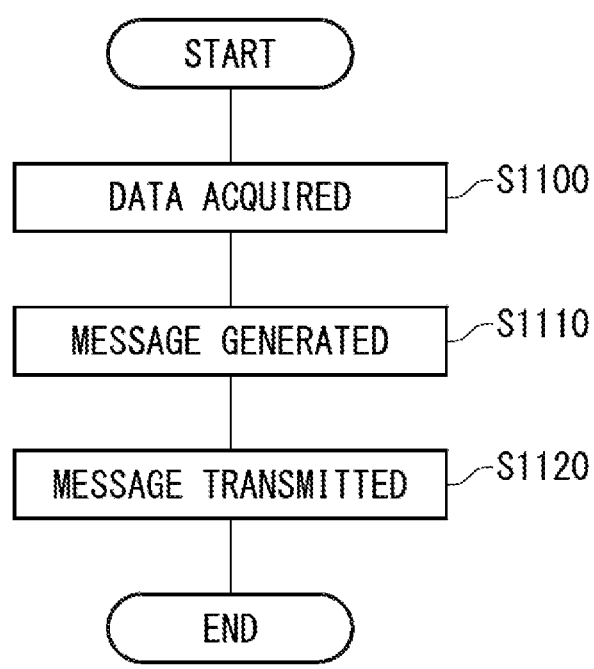
FIG. 11 shows an operational flow of the transmission apparatus 20 according to the present embodiment.

FIG. 11 shows an operational flow of the transmission apparatus 20 according to the present embodiment. At S1100, the transmission data acquiring section 900 acquires the plurality of sets of first data and the second data to be transmitted, from the transmission side apparatus.

At S1110, the message generating section 910 generates each message in the message group used for transmitting the plurality of sets of first data and the second data. The message generating section 910 may have a function for encoding additional information in a reserved field of the message, in addition to encoding the plurality of sets of first data and the second data. With the communication protocol shown in FIG. 2, the status pulse is capable of transmitting 1-nibble (4-bit) data (partial data of the second data), but only two bits, which are bit 2 and bit 3, in the 4-bit data field are used in the Short format and Enhanced format shown in FIGS. 4 to 6, and two bits, which are bit 1 and bit 0, are a reserved field. Therefore, the message generating section 910 may encode the additional information in the reserved field of this partial data.

At S1120, the transmitting section 920 transmits to the receiving apparatus 30 each message of the message group generated by the message generating section 910.

According to the transmission apparatus 20 shown above, additional information other than the first data and the second data is encoded in the reserved field of the message and transmitted. As an example, the message generating section 910 may encode information indicating at least one of an identification information, a manufacturer, a manufacturing location, a manufacturing date, a lot number, and the like for at least one of the transmission side apparatus, the transmission apparatus 20, and an another apparatus related to the transmission apparatus 20, in the reserved field of the partial data encoded in the status pulse of each message included in the message group. The second data acquiring section 660 in the receiving apparatus 30 may store the additional information acquired from the status pulse of each message. In this way, when an abnormality has been detected in an apparatus relating to the transmission apparatus 20, a manager who performs maintenance and management of the communication scheme 10 can acquire the additional information stored by the second data acquiring section 660 in the receiving apparatus 30 and acquire the above information relating to the apparatus in which the abnormality occurred.

Furthermore, the message generating section 910 may encode error detecting information for detecting an error in each message in the message group, in the reserved field of the partial data of each message. In this way, the error detecting section 670 in the receiving apparatus 30 can detect an error in each message in the message group, based on the error detecting information. The message generating section 910 may use information indicating a location or portion of each message in the message group, as the error detecting information. For example, the message generating section 910 sets bit 1 in the reserved field to be "0" for even-numbered messages in the message group, and sets bit 1 in the reserved field to be "1" for odd-numbered messages in the message group. The error detecting section 670 in the receiving apparatus 30 that has received such a message group can detect that a message has been dropped, if bit 1 in the reserved field has the same value in two consecutive messages.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA®, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 12:
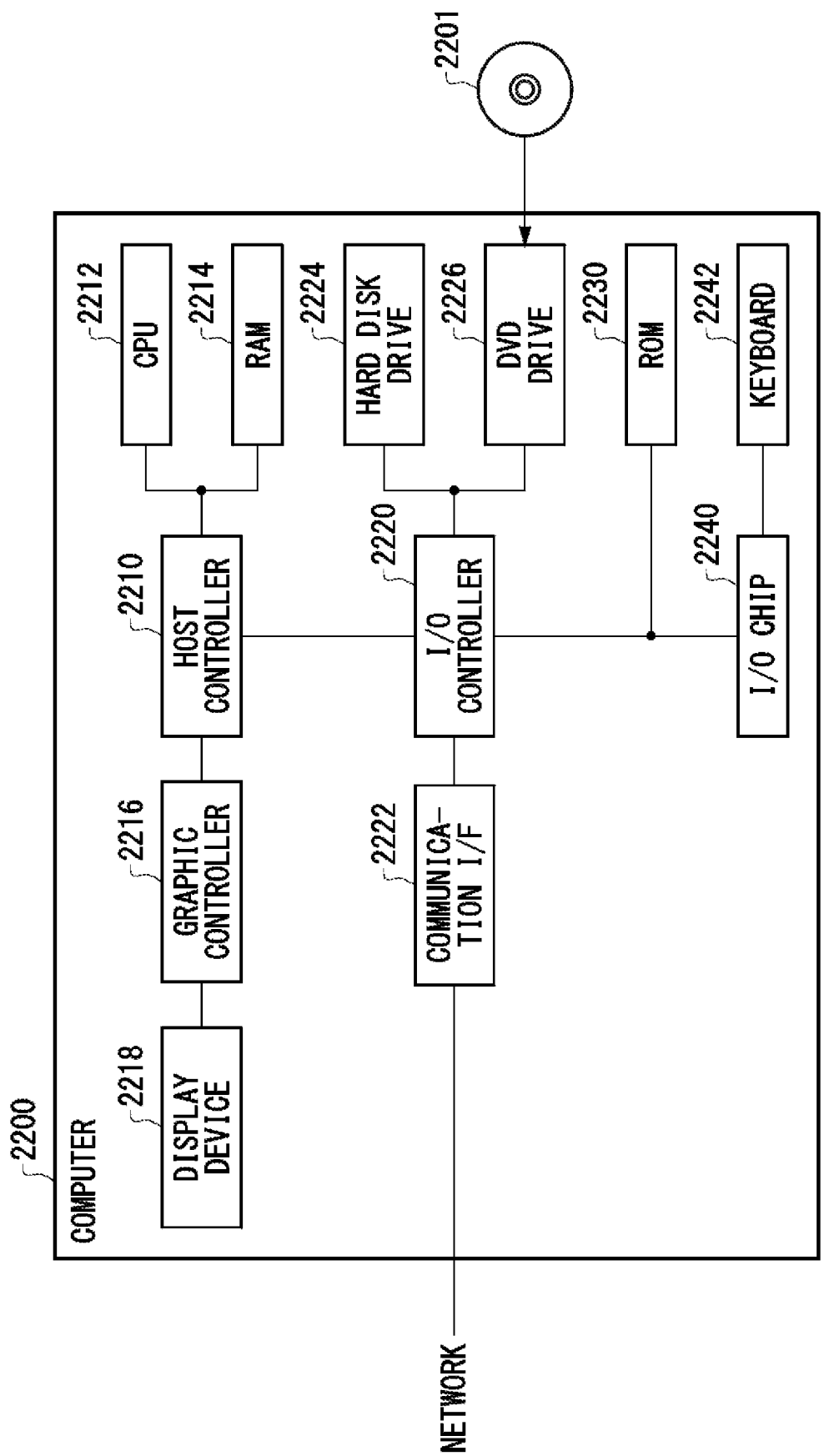
FIG. 12 shows an exemplary configuration of a computer 2200 according to the present embodiment.

FIG. 12 shows an example of a computer 2200 in which aspects of the present invention may be wholly or partly embodied. A program that is installed in the computer 2200 can cause the computer 2200 to function as or perform operations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphic controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphic controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention has have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A receiving apparatus comprising:
a receiving section that receives a message including a synchronization pulse having a predetermined pulse width and a first data pulse having a pulse width corresponding to a value of first data;
an error detecting section that detects an error in response to a number of non-synchronization pulses that are consecutive after the synchronization pulse being outside a predetermined number range;
a synchronization pulse detecting section that detects, as the synchronization pulse, a pulse having a pulse width that is within a predetermined synchronization pulse allowable width range including the predetermined pulse width; and
a data pulse detecting section that detects, as the first data pulse, a pulse at a predetermined pulse position using the synchronization pulse as a reference.

2. The receiving apparatus according to claim 1, wherein the error detecting section detects the error in response to the number of non-synchronization pulses that are consecutive after the synchronization pulse exceeding an upper limit of the predetermined number range.

3. The receiving apparatus according to claim 1, wherein the error detecting section detects the error in response to the number of non-synchronization pulses between synchronization pulses being less than a lower limit of the predetermined number range.

4. The receiving apparatus according to claim 1, wherein the error detecting section detects the error in response to the number of non-synchronization pulses and further in response to the pulse width of the first data pulse being outside a predetermined data pulse allowable width range.

5. The receiving apparatus according to claim 1, wherein the message further includes a second data pulse having a pulse width corresponding to a value of partial data of second data, and
the receiving apparatus further comprises a data acquiring section that acquires the second data that has been encoded after being divided into second data pulses, each of which is the second data pulse, included in a plurality of messages, each of which is the message, of a message group.

6. The receiving apparatus according to claim 5, wherein the data acquiring section further acquires error detecting information that has been encoded in a reserved field of the partial data expressed by the second data pulse of each message included in the message group, and
the error detecting section detects an error of each message in the message group, based on the error detecting information.

7. The receiving apparatus according to claim 5, wherein the data acquiring section, in response to an error having been detected in a first message included in a first message group, compensates second data acquired from the first message group with the partial data expressed by the second data pulse of a second message, corresponding to the first message, in a second message group.

8. A receiving apparatus comprising:
a receiving section that receives a message including a synchronization pulse having a predetermined pulse width and a first data pulse having a pulse width corresponding to a value of first data;
an error detecting section that detects an error in response to the pulse width of the first data pulse being outside a predetermined data pulse allowable width range;
a synchronization pulse detecting section that detects, as the synchronization pulse, a pulse having a pulse width that is within a predetermined synchronization pulse allowable width range including the predetermined pulse width; and
a data pulse detecting section that detects, as the first data pulse, a pulse at a predetermined pulse position using the synchronization pulse as a reference.

9. The receiving apparatus according to claim 8, wherein
the message further includes a second data pulse having
a pulse width corresponding to a value of partial data of
second data, and
the receiving apparatus further comprises a data acquiring
section that acquires the second data that has been
encoded after being divided into second data pulses,
each of which is the second data pulse, included in a
plurality of messages, each of which is the message, of
a message group.

10. A transmission apparatus comprising:
a transmission data acquiring section that acquires a
plurality of sets of first data and second data to be
transmitted;
a message generating section that generates a plurality of
messages in a message group, each one message of the
plurality of messages including a synchronization pulse
having a predetermined pulse width, a first data pulse
having a pulse width corresponding to a value of the
first data that corresponds to the one message, among
the plurality of sets of the first data, and a second data
pulse having a pulse width corresponding to a value of
partial data that is of the second data and to be encoded
in the one message; and
a transmitting section that transmits each one message of
the plurality of messages in the message group,
wherein
the message generating section encodes additional information in a reserved field of the partial data expressed
by the second data pulse.

* * * * *